United States Patent
Moon

(10) Patent No.: US 7,733,618 B2
(45) Date of Patent: Jun. 8, 2010

(54) ELECTROSTATIC DISCHARGE DEVICE

(75) Inventor: Jung Eon Moon, Ichon (KR)

(73) Assignee: Hynix Semiconductor Inc. (KR)

( * ) Notice: Subject to any disclaimer, the term of this patent is extended or adjusted under 35 U.S.C. 154(b) by 107 days.

(21) Appl. No.: 12/166,096

(22) Filed: Jul. 1, 2008

(65) Prior Publication Data

US 2009/0009917 A1    Jan. 8, 2009

(30) Foreign Application Priority Data

Jul. 3, 2007    (KR) ...................... 10-2007-0066633

(51) Int. Cl.
   *H02H 9/00*    (2006.01)
   *H02H 3/20*    (2006.01)
   *H02H 9/04*    (2006.01)
   *H02H 3/22*    (2006.01)

(52) U.S. Cl. .................. 361/56; 361/91.1; 361/111; 361/118; 257/199; 257/200; 257/288; 257/335

(58) Field of Classification Search ............. 361/56
See application file for complete search history.

(56) References Cited

U.S. PATENT DOCUMENTS 6,861,680 B2*   3/2005   Ker et al. ............... 257/199
6,898,060 B2*   5/2005   Juliano et al. ............. 361/56
7,609,493 B1*   10/2009   Salman et al. ............. 361/56

* cited by examiner

*Primary Examiner*—Stephen W Jackson
*Assistant Examiner*—Dharti H Patel
(74) *Attorney, Agent, or Firm*—Baker & McKenzie LLP

(57) ABSTRACT

An electrostatic discharge device includes a first protection element including a MOS transistor type first diode, which provides a first capacitor including a first insulation layer, and provides a first path between an input/output pad and a power supply voltage line using the first diode, for discharging static electricity, a second protection element providing a second path between the input/output pad and a ground voltage line for discharging the static electricity, a trigger circuit including a resistor that is connected in series to the first capacitor, and a power clamp element providing a third path for discharging the static electricity between the power supply voltage line and the ground voltage line by a voltage applied to the resistor.

9 Claims, 4 Drawing Sheets

200

ELECTROSTATIC DISCHARGE DEVICE

CROSS-REFERENCE TO RELATED APPLICATIONS

The present application claims priority Under 35 U.S.C. 119(a) to Korean patent application number 10-2007-0066633 filed with the Korean Patent Office on Jul. 3, 2007, and which is incorporated herein by reference in their entirety if set forth in full.

BACKGROUND

1. Technical Field

The embodiments described herein relate to an electrostatic discharge device, and more particularly, to an electrostatic discharge device which has a decreased layout area.

2. Related Art

Conventional semiconductor device often include an electrostatic discharge device, which is connected between an input/out (I/O) pad and an internal circuit. When a semiconductor device comes into contact with a charged human body or machine, static electricity can flow to the internal circuit through the I/O pad. In such instances, the electrostatic discharge device protects the internal circuit from the static electricity.

As semiconductor technologies trend toward higher speed operation and increased integration, the thickness of the insulation layer of transistor gates included in the internal circuits is decreasing. As a result, the voltage level at which the insulation layer is destroyed, i.e., as a result of static electricity, also decreases in proportion to the decrease in the thickness of the insulation layer. Therefore, it is becoming more difficult to design an electrostatic discharge device with sufficient margin to protect the internal circuits from, e.g., static electricity.

FIG. 1 is a diagram illustrating a conventional electrostatic discharge device. The conventional electrostatic discharge device includes a capacitor C1 and a resistor R2 for detecting static electricity.

When static electricity is introduced through an input/output pad (I/O), protection elements 102 and 104 discharge the static electricity introduced through the input/output pad (I/O) to the line connected to a power supply voltage (Vcc) terminal and to the line connected to a ground voltage (Vss) terminal. At this time, a transistor 103 discharges the static electricity flowing to an input buffer via the voltage applied to a resistor R1, and the gate oxide layer of the transistor included in the input buffer is protected from the static electricity.

If a voltage difference occurs between the line connected to the power supply voltage (Vcc) terminal and the line connected to the ground voltage (Vss) terminal due to the static electricity, then a voltage resulting from the static electricity is applied to a capacitor C1 and a resistor R2, and a power clamp element 105 discharges the static electricity via the voltage applied to the gate thereof.

The diode 104 of FIG. 1 has a configuration as shown in FIG. 2. The diode 104 is formed over a P-well. A P+ junction area and an N+ junction area are separated from each other by an STI layer, the N+ junction area comes into contact with the input/output pad I/O, and the P+ junction area comes into contact with the line connected to the ground voltage (Vss) terminal.

The diode 102 of FIG. 1 has a configuration as shown in FIG. 3. The diode 102 is formed over an N-well. A P+ junction area and an N+ junction area are separated from each other by an STI layer, the P+ junction area comes into contact with the input/output pad I/O, and the N+ junction area comes into contact with the line connected to the power supply voltage (Vcc) terminal.

The electrostatic discharge device shown in FIG. 1 has an advantage in that it has a low triggering voltage. However, in the electrostatic discharge device shown in FIG. 1, the capacitor C1 and the resistor R2 provided to drive the power clamp element 105 are designed to have a large area in order to handle the threshold voltage of the power clamp element 105, and must be installed for each input/output pad I/O. This clearly has an adverse effect on the chip area.

The area demand and the fact that the capacitor C1 and the resistor R2 for driving the power clamp element 105 must be installed for each input/output pad I/O can impose a substantial burden in terms of chip size, the detrimental effect of which is heightened due to the increased integration and reduce chip size of today's semiconductor devices.

SUMMARY

An electrostatic discharge device that occupies a small area and can effectively prevent the gate of an internal circuit from being destroyed is described herein.

In one aspect, an electrostatic discharge device comprises a first protection element including a MOS transistor type diode and providing a first path between an input/output pad and a power supply voltage line, for discharging static electricity, a second protection element providing a second path between the input/output pad and a ground voltage line, for discharging the static electricity, a trigger circuit including a resistor that is connected in series to a gate electrode formed in an insulation layer in the first protection element, and a power clamp element for switching the power supply voltage line and the ground voltage line by a voltage transmitted from the trigger circuit in correspondence to the static electricity and thereby providing a third path for discharging the static electricity.

The first protection element comprises an N-well, an N-type junction area, which can be formed over the N-well and which can be connected to the power supply voltage line, a P-type junction area, which can be formed over the N-well and which can be connected to the input/output pad, and the insulation layer and the gate electrode, which are deposited over the N-well between the N-type junction area and the P-type junction area.

The second protection element comprises a P-well, an N-type junction area, which can be formed over the P-well and which can be connected to the input/output pad, a P-type junction area, which can be formed over the P-well and which can be connected to the ground voltage line, and an insulation layer and a gate electrode, which can be deposited over the P-well between the N-type junction area and the P-type junction area.

The second protection element comprises an N-well, an N-type junction area, which can be formed over the N-well and which can be connected to the input/output pad, a P-type junction area, which can be formed over the N-well and which can be connected to the ground voltage line, and an insulation layer and a gate electrode, which can be deposited over the N-well between the N-type junction area and the P-type junction area.

In another aspect, an electrostatic discharge device comprises a first protection element including a MOS transistor type first diode which provides a first capacitor including a first insulation layer, and providing a first path between an input/output pad and a power supply voltage line using the first diode, for discharging static electricity, a second protection element providing a second path between the input/output pad and a ground voltage line, for discharging the static electricity, a trigger circuit including a resistor which is connected in series to the first capacitor, and a power clamp element providing a third path for discharging the static electricity between the power supply voltage line and the ground voltage line by a voltage applied to the resistor.

The first protection element comprises the first diode including an N-well, which can be connected to the power supply voltage line, and a P-type junction area, which can be formed over the N-well and which can be connected to the input/output pad, and the first capacitor including the N-well, the first insulation layer deposited over the N-well, and a gate electrode.

The N-well can be connected to the power supply voltage line by an N-type junction area.

The second protection element comprises a second diode including a P-well, which can be connected to the ground voltage line, and an N-type junction area, which can be formed over the P-well and which can be connected to the input/output pad, and a second capacitor including the P-well, a second insulation layer deposited over the P-well, and a gate electrode, and being in an electrically floating state.

The P-well can be connected to the ground voltage line by a P-type junction area.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF A SPECIFIC EMBODIMENT

In the embodiments described below, a protection element for guiding the static electricity, introduced through an input/output pad, to a power supply voltage (Vcc) terminal or a ground voltage (Vss) terminal is configured using a MOS transistor type diode. A voltage for driving a power clamp element is detected using a capacitor including the gate insulation layer of the MOS transistor type diode. Accordingly, an electrostatic discharge device for preventing the gate of the internal circuit from being destroyed by the static electricity that occupies a minimum area can be achieved.

Figure 1:
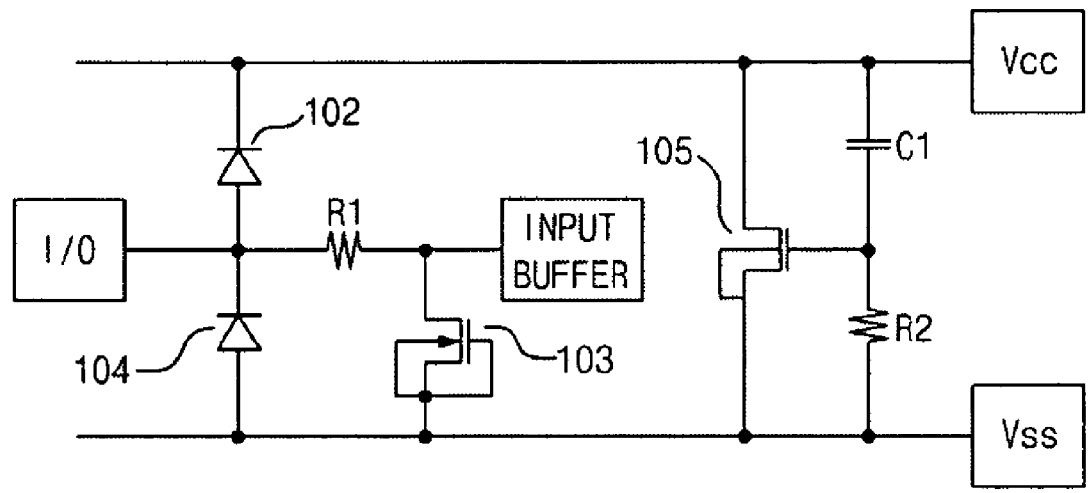
FIG. 1 is a circuit diagram illustrating a conventional electrostatic discharge device.
Figure 2:
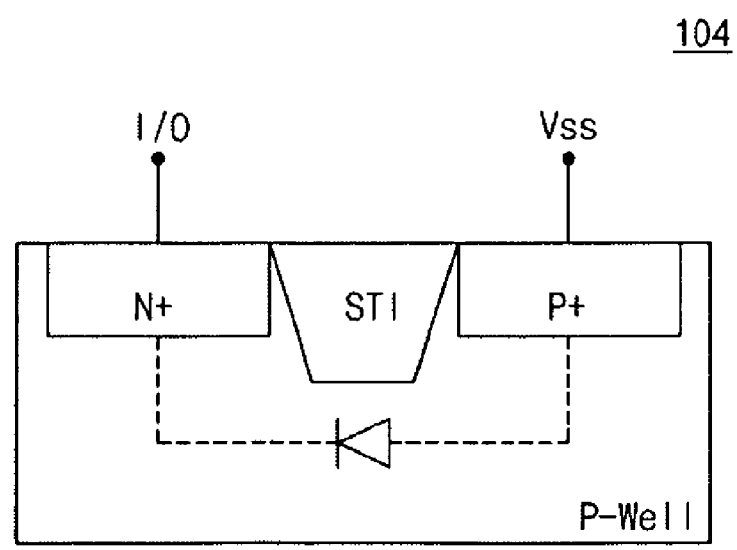
FIG. 2 is a sectional view illustrating one diode shown in the circuit of FIG. 1.
Figure 3:
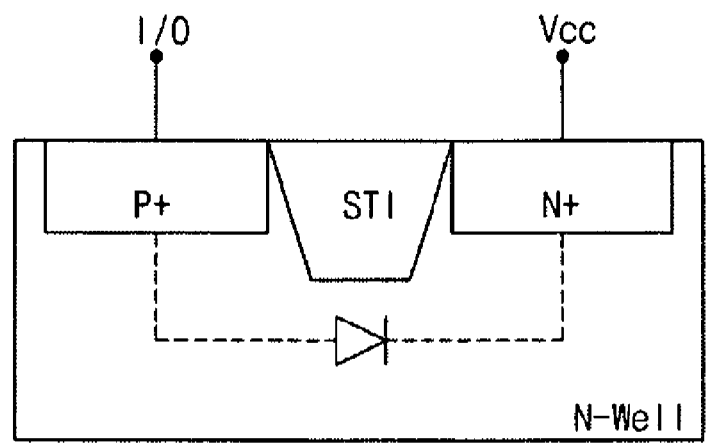
FIG. 3 is a sectional view illustrating another diode shown in the circuit of FIG. 1.
Figure 4:
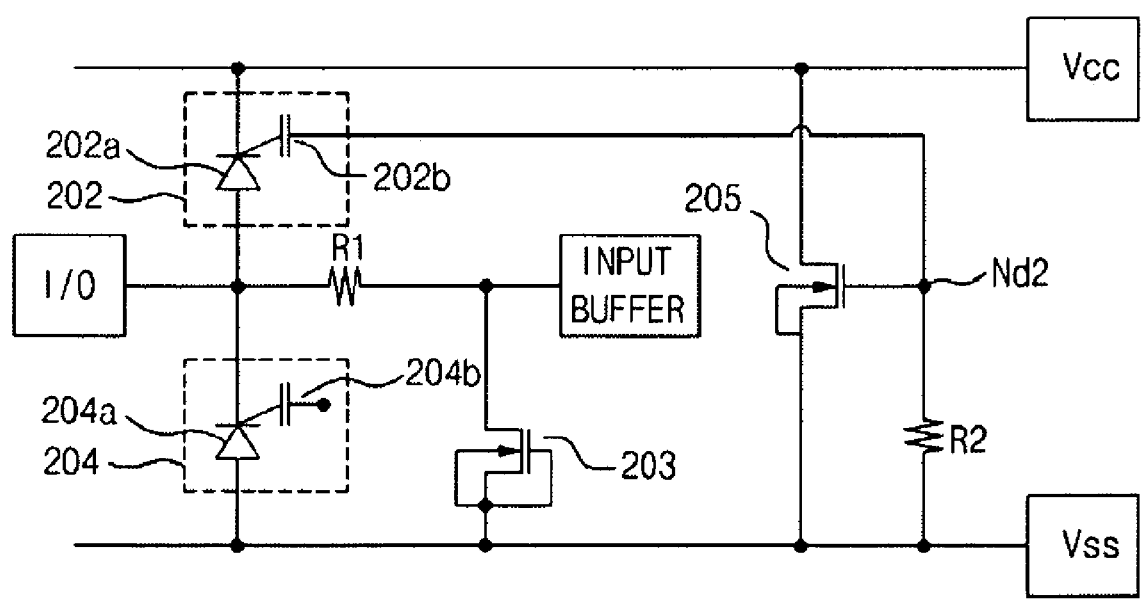
FIG. 4 is a circuit diagram illustrating an electrostatic discharge device in accordance with one embodiment.

FIG. 4 is a diagram illustrating an example electrostatic discharge device 200 configured in accordance with one embodiment. Referring to FIG. 4, the electrostatic discharge device 200 functions to prevent the static electricity introduced through an input/output pad I/O from being transmitted to an internal circuit (for example, an input buffer) and destroying the gate insulation layer of a transistor.

As can be seen in FIG. 4 the electrostatic discharge device 200 can include protection elements 202 and 204, resistors R1 and R2, a transistor 203, and a power clamp element 205 between power supply voltage (Vcc) and ground voltage (Vss) lines.

Figure 5:
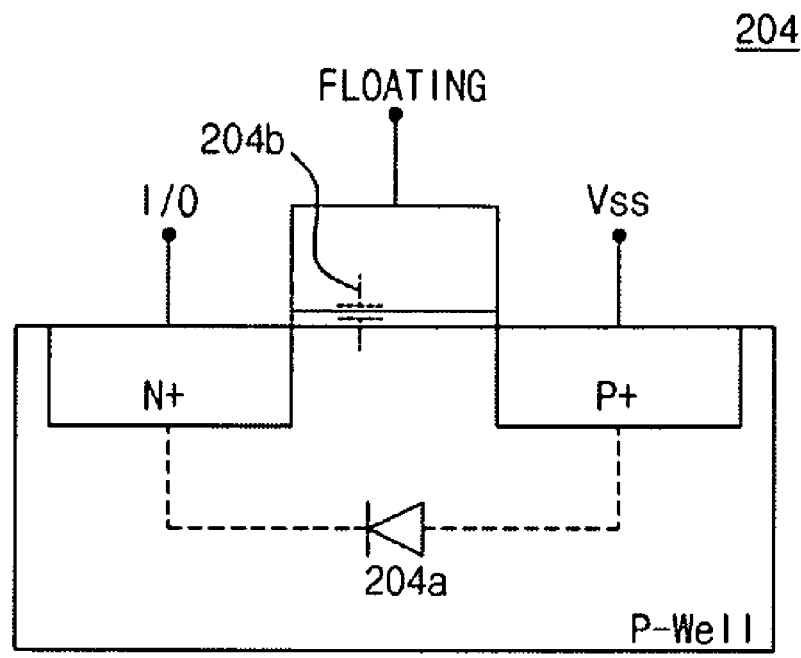
FIG. 5 is a sectional view illustrating one diode shown in the circuit of FIG. 4.

The protection element 202 can comprise a MOS transistor type diode 202a as shown and described in detail with respect to FIG. 5. The protection element 202 can be configured to discharge static electricity between an input/output pad I/O and the line connected to a power supply voltage (Vcc) terminal, and to provide a capacitor 202b including a gate insulation layer.

The resistor R1 and the transistor 203 can be configured to perform the functions of triggering the static electricity introduced toward the input buffer and thereby protecting the input buffer, constituting the internal circuit, from the static electricity.

The resistor R2 can be arranged between the capacitor 202b formed in the gate of the protection element 202 and the line connected to a ground voltage (Vss) terminal, and can form a trigger circuit in cooperation with the capacitor 202b. A voltage corresponding to the static electricity having passed through the protection element 202 is applied to the resistor R2. The voltage applied to the resistor R2 is applied between the gate and the source of the transistor constituting the power clamp element 205.

Figure 6:
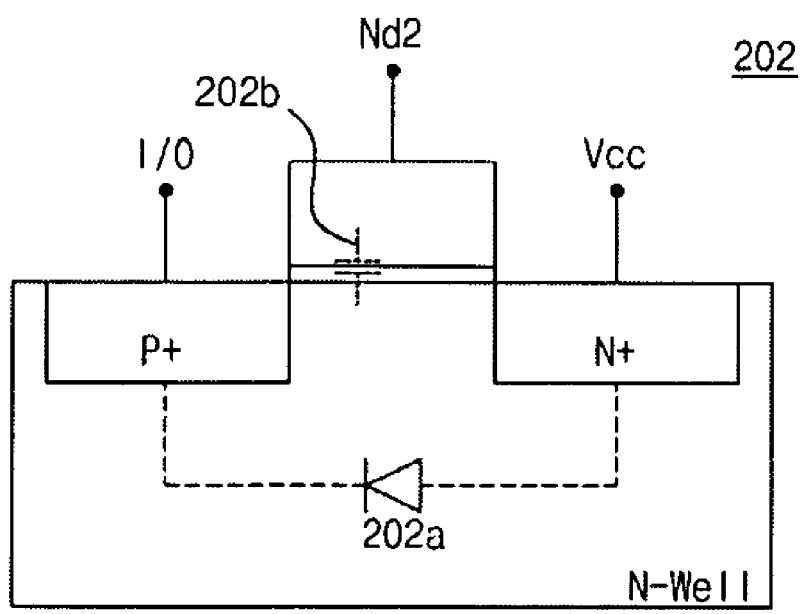
FIG. 6 is a sectional view illustrating another diode shown in the circuit of FIG. 4.

The protection element 204 can comprise an NMOS transistor type diode 204a as shown and described in detail with respect to FIG. 6. The protection element 204 can be configured to discharge static electricity between the input/output pad I/O and the line connected to the ground voltage (Vss) terminal. While the gate of the diode 204a can include a capacitor 204b, since the gate is in a floating state, the capacitor 204b will exert no influence on the operation of the diode 204a with respect to the static electricity.

Thus, in the protection element 202, the diode 202a and the capacitor 202b, which uses the insulation layer between a well and a gate electrode in the area of the diode 202a, can be coupled with each other. The protection element 202 can be configured to transmit the static electricity introduced through the input/output pad I/O to the line connected to the power supply voltage (Vcc) terminal.

The voltage corresponding to the static electricity flowing through the capacitor 202b can then be applied to the resistor R2. The voltage applied to the resistor R2 can be applied between the gate and the source of the power clamp element 205.

The power clamp element 205 can comprise an NMOS transistor. When the level of the voltage applied between the gate and the source of the power clamp element 205 is higher than the level of a threshold voltage, then the power clamp element 205 can be configured to discharge the static electricity on the line connected to the power supply voltage (Vcc) terminal to the line connected to the ground voltage (Vss) terminal.

The protection element 204 can include the diode 204a, which can be configured to operate based on a voltage difference between both terminals thereof. The protection element 204 can be configured to operate in correspondence to the static electricity between the input/output pad (I/O) and the line of the ground voltage (Vss) terminal.

Referring to FIG. 5, the protection element 204 can be formed over a P-well region and includes an N+ junction area and a P+ junction area, which can be separated from each other by interposing a gate between them. The diode 204a can be formed by a path including the P+ junction area, the P-well and the N+ junction area. The capacitor 204b can be formed by the P-well, a gate electrode and an insulation layer between them. The gate electrode can be in an electrically floating state. The P+ junction area can come into contact with the line connected to the ground voltage (Vss) terminal, and the N+ junction area can be connected with the input/output pad (I/O).

Referring to FIG. 6, the protection element 202 can be formed over an N-well region and includes an N+ junction area and a P+ junction area, which can be separated from each other by interposing a gate between them. The diode 202a can be formed by a path including the P+ junction area, the N-well and the N+ junction area. The capacitor 202b can be formed by the N-well, a gate electrode and an insulation layer between them. The gate electrode can be connected to a node Nd2 to which the resistor R2 is connected. The N+ junction area can come into contact with the line connected to the power supply voltage (Vcc) terminal, and the P+ junction area can be connected with the input/output pad (I/O). Here, the well can be formed as a P-type, and in this case, the operation of the diode 202a between the junction areas and a substrate can be implemented in the same manner as in the case of the N-type well.

Hereafter, the operation of the electrostatic discharge device 200 in response to the introduction of static electricity will be described with reference to FIGS. 4 through 6.

In the event that positive static electricity is introduced through the input/output pad (I/O), due to a potential difference between the input/output pad (I/O) and the line connected to the power supply voltage (Vcc) terminal, the diode 202a is turned on, and the static electricity is transmitted to the line connected to the power supply voltage (Vcc) terminal.

If the diode 202a is turned on by the introduction of the static electricity, then the static electricity initially having the electrical characteristic of alternate current (AC) is transmitted through the capacitor 202b, which is formed in the diode 202a, to the node Nd2, to which the resistor R2 is connected.

Voltage drop caused by the static electricity occurs in the resistor R2, which is connected to the node Nd2, and the voltage applied to the resistor R2 turns on the power clamp element 205. That is to say, if the level of the voltage applied between the gate and the source of the power clamp element 205 is higher than the level of a threshold voltage, then the power clamp element 205 is turned on and discharges the static electricity on the line connected to the power supply voltage (Vcc) terminal to the line connected to the ground voltage (Vss) terminal. Thereafter, the static electricity transmitted to the line connected to the ground voltage (Vss) terminal is discharged through a ground voltage (Vss) pad.

On the contrary, in the event that negative static electricity is introduced through the input/output pad (I/O) to be discharged through a power supply voltage (Vcc) pad, the static electricity initially flows to the ground voltage (Vss) line through the N-well and the capacitor 202b of the protection element 202 to which a power supply voltage (Vcc) is applied, and induces voltage drop on both terminals of the resistor R2.

If the level of the voltage applied to the gate of the power clamp element 205 is higher than the level of the threshold voltage, then the power clamp element 205 discharges the negative static electricity on the ground voltage (Vss) line to the power supply voltage (Vcc) line. Thereafter, the static electricity discharged to the power supply voltage (Vcc) line is discharged through the power supply voltage (Vcc) pad.

Consequently, since the trigger circuit is configured using the capacitor 202b formed in the gate insulation layer of the diode 202a and the resistor R2, it is not necessary to provide a capacitor for each input/output pad (I/O), whereby the size of a chip can be decreased.

Figure 7:
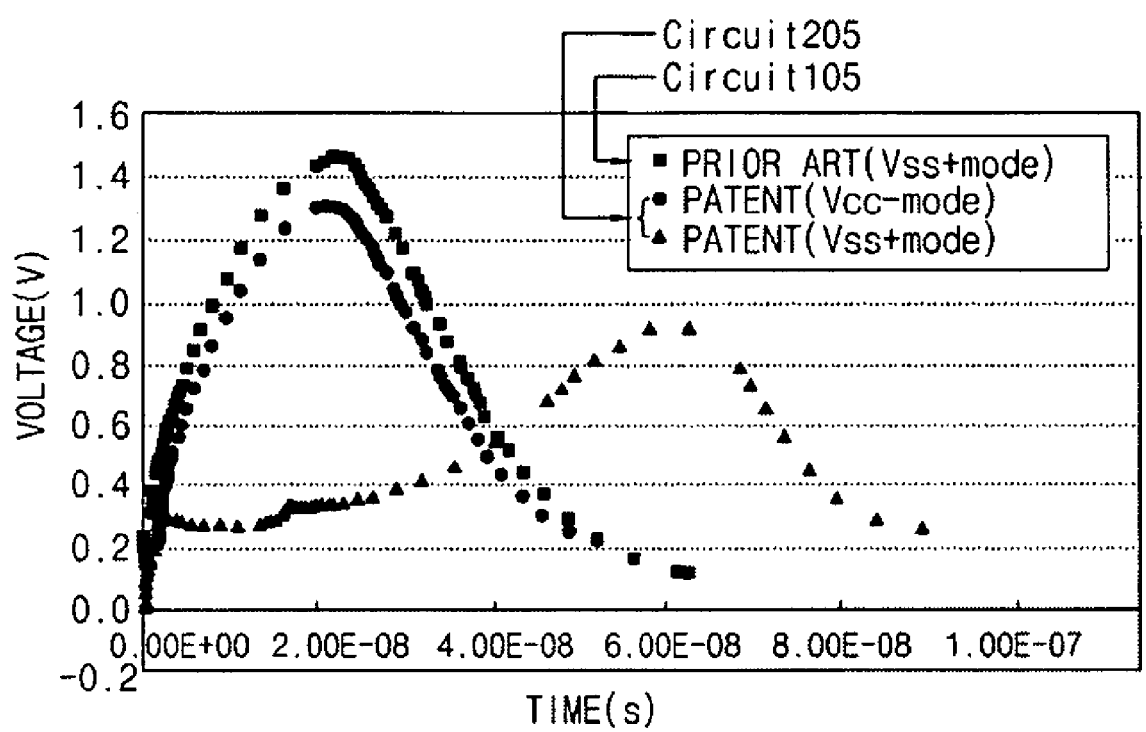
FIG. 7 is a graph illustrating simulation results comparing the voltages applied to the gates of power clamp elements included in the circuits of FIGS. 1 and 4.

Referring to FIG. 7, a comparison of the voltage changes depending upon the static electricity applied to the power clamp elements 105 and 205 are illustrated.

The voltage for clamp element 105, which employs the capacitor C1, is designated as circuit 105. The voltages for power clamp element 205 re designated as circuit 205. The given voltages indicate those applied between the gate and the source of the power clamp element 205 when positive static electricity is introduced through the input/output pad (Vss+ mode) and when negative static electricity is introduced through the input/output pad (Vcc-mode).

In circuit 105, a voltage drop of about 1.3V is induced. In circuit 205, when positive static electricity is introduced through the input/output pad (Vss+mode), a voltage drop of about 0.9V is induced, and when negative static electricity is introduced through the input/output pad (Vcc-mode), a voltage drop of about 1.45V is induced. It will be appreciated that, by applying a voltage greater than the threshold voltage (Vth) to the power clamp element 205, the same discharging effects can be accomplished when static electricity is discharged.

As is apparent from the above description, in the electrostatic discharge device configured according to the embodiments described herein, a capacitor is formed using a gate insulation layer formed in a protection element, whereby it is possible to provide an electrostatic discharge device capable of allowing a chip size to be decreased.

It will be apparent to those skilled in the art that various modifications and changes may be made without departing from the scope and spirit of the embodiments described herein. Therefore, it should be understood that the above embodiments are not limitative, but illustrative in all aspects. The scope of the above embodiments are defined by the appended claims rather than by the description preceding them, and therefore all changes and modifications that fall within metes and bounds of the claims, or equivalents of such metes and bounds are therefore intended to be embraced by the claims.

What is claimed is:

1. An electrostatic discharge device, comprising:
   an input/output pad;
   a power supply voltage line;
   a ground voltage line;
   a first protection element including a MOS transistor diode and an insulation layer that includes a gate electrode, the first protection element configured to provide a first path between the input/output pad and the power supply voltage line for discharging static electricity;
   a second protection element configured to provide a second path between the input/output pad and the ground voltage line for discharging the static electricity;
   a trigger circuit including a resistor connected in series to the gate electrode formed in the insulation layer in the first protection element, the trigger circuit configured to transmit a voltage in response to static electricity; and
   a power clamp element coupled with the trigger circuit element, the power clamp element configured to switch the power supply voltage line and the ground voltage line based on the voltage transmitted from the trigger circuit in response to the static electricity, thereby providing a third path for discharging the static electricity.

2. The electrostatic discharge device according to claim 1, wherein the first protection element further comprises an N-well, an N-type junction area formed over the N-well and connected to the power supply voltage line, a P-type junction area formed over the N-well and connected to the input/output pad, and wherein the insulation layer and the gate electrode are deposited over the N-well between the N-type junction area and the P-type junction area.

3. The electrostatic discharge device according to claim 1, wherein the second protection element comprises a P-well, an N-type junction area formed over the P-well and connected to the input/output pad, a P-type junction area formed over the P-well and connected to the ground voltage line, and an insulation layer and a gate electrode deposited over the P-well between the N-type junction area and the P-type junction area.

4. The electrostatic discharge device according to claim 1, wherein the second protection element comprises an N-well, an N-type junction area formed over the N-well and connected to the input/output pad, a P-type junction area formed over the N-well and connected to the ground voltage line, and an insulation layer and a gate electrode which are deposited over the N-well between the N-type junction area and the P-type junction area.

5. An electrostatic discharge device comprising:
   an input/output pad;
   a power supply voltage line;
   a ground voltage line;
   a first protection element including a MOS transistor first diode comprising a first capacitor including a first insulation layer, the first protection element configured to provide a first path for discharging static electricity between the input/output pad and the power supply voltage line using the first diode;
   a second protection element configured to provide a second path for discharging the static electricity between the input/output pad and the ground voltage line;
   a trigger circuit including a resistor connected in series to the first capacitor; and
   a power clamp element configured to provide a third path for discharging the static electricity between the power supply voltage line and the ground voltage line based on a voltage applied to the resistor.

6. The electrostatic discharge device according to claim 5, wherein the first diode includes an N-well connected to the power supply voltage line, and a P-type junction area formed over the N-well and connected to the input/output pad, and wherein the first capacitor includes the N-well, the first insulation layer deposited over the N-well, and a gate electrode.

7. The electrostatic discharge device according to claim 6, wherein the N-well is connected to the power supply voltage line by an N-type junction area.

8. The electrostatic discharge device according to claim 5, wherein the second protection element comprises:
   a second diode that includes a P-well connected to the ground voltage line and an N-type junction area formed over the P-well and connected to the input/output pad; and
   a second capacitor including the P-well, a second insulation layer deposited over the P-well, and a gate electrode, the gate electrode being in an electrically floating state.

9. The electrostatic discharge device according to claim 8, wherein the P-well is connected to the ground voltage line by a P-type junction area.

* * * * *